(12) United States Patent
Chakravarti et al.

(10) Patent No.: US 7,119,016 B2
(45) Date of Patent: Oct. 10, 2006

(54) DEPOSITION OF CARBON AND NITROGEN DOPED POLY SILICON FILMS, AND RETARDED BORON DIFFUSION AND IMPROVED POLY DEPLETION

(75) Inventors: Ashima B. Chakravarti, Hopewell Junction, NY (US); Anita Madan, Danbury, CT (US); Woo-Hyeong Lee, Poughquag, NY (US); Gregory Wayne Dibello, Mahopac, NY (US); Ramaseshan Suryanarayanan Iyer, Santa Clara, CA (US)

(73) Assignees: International Business Machines Corporation, Armonk, NY (US); Applied Materials, Inc., Santa Clara, CA (US)

(*) Notice: Subject to any disclaimer, the term of this patent is extended or adjusted under 35 U.S.C. 154(b) by 13 days.

(21) Appl. No.: 10/684,596

(22) Filed: Oct. 15, 2003

(65) Prior Publication Data

US 2005/0085054 A1  Apr. 21, 2005

(51) Int. Cl.
 *H01L 21/36* (2006.01)
(52) U.S. Cl. .................... 438/680; 438/790; 438/789
(58) Field of Classification Search ............ 438/680, 438/790, 789
See application file for complete search history.

(56) References Cited

U.S. PATENT DOCUMENTS

| | | | |
|---|---|---|---|
| 6,268,299 B1* | 7/2001 | Jammy et al. .............. 438/791 |
| 6,486,015 B1* | 11/2002 | Chaudhary et al. ......... 438/229 |
| 6,500,772 B1* | 12/2002 | Chakravarti et al. ........ 438/789 |
| 6,518,626 B1 | 2/2003 | Moore | |
| 7,001,844 B1* | 2/2006 | Chakravarti et al. ........ 438/680 |
| 2003/0020108 A1 | 1/2003 | Weimer et al. | |
| 2004/0121085 A1* | 6/2004 | Wang et al. ................. 427/569 |
| 2004/0194706 A1* | 10/2004 | Wang et al. ................. 118/722 |
| 2005/0085054 A1* | 4/2005 | Chakravarti et al. ........ 438/478 |
| 2005/0287747 A1* | 12/2005 | Chakravarti et al. ........ 438/288 |
| 2006/0040497 A1* | 2/2006 | Chakravarti et al. ........ 438/680 |

OTHER PUBLICATIONS

Jalabert, L.; et al., Reduction of boron penetration through thin silicon oxide with a nitrogen doped silicon layer; Pergamon; Microelectronics Reliability 41 (2001) 981-985.

* cited by examiner

Primary Examiner—Laura M. Schillinger
(74) Attorney, Agent, or Firm—Whitham, Curtis, Christofferson & Cook, PC; Yuanmin Cai

(57) ABSTRACT

A compound that includes at least Si, N and C in any combination, such as compounds of formula $(R-NH)_{4-n}SiX_n$ wherein R is an alkyl group (which may be the same or different), n is 1, 2 or 3, and X is H or halogen (such as, e.g., bis-tertiary butyl amino silane (BTBAS)), may be mixed with silane or a silane derivative to produce a film. A polysilicon silicon film may be grown by mixing silane $(SiH_4)$ or a silane derviative and a compound including Si, N and C, such as BTBAS. Films controllably doped with carbon and/or nitrogen (such as layered films) may be grown by varying the reagents and conditions.

5 Claims, 6 Drawing Sheets

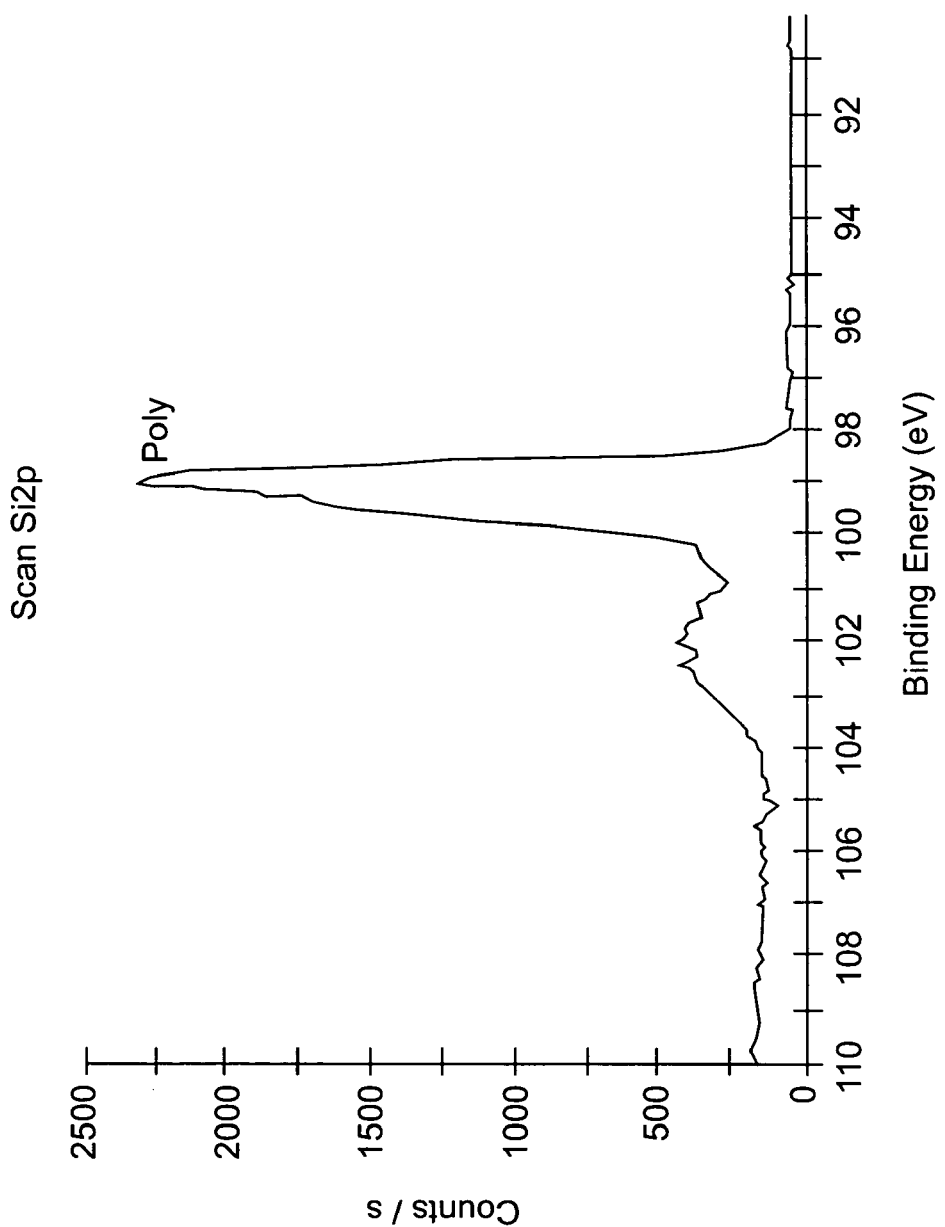

DEPOSITION OF CARBON AND NITROGEN DOPED POLY SILICON FILMS, AND RETARDED BORON DIFFUSION AND IMPROVED POLY DEPLETION

BACKGROUND OF THE INVENTION

1. Field of the Invention

The present invention generally relates to integrated circuit manufacture, and more particularly to thin films and their production.

2. Background Description

In logic technologies at a size of 90 nm and smaller, the quality and characteristics of polysilicon is a major factor in determining the gate dielectric scalability. In order to reduce depletion capacitance of gate polysilicon, higher doping concentration at the polysilicon and gate oxide interface has been strongly required. This requirement has been met by increasing poly dopant dose and higher temperature activation. However, this approach may create serious gate dopant penetration into the channel which results in threshold voltage shift, surface punch-through, and device instability.

In recent literature, L. Jalabert et al., "Reduction of boron penetration through thin silicon oxide with a nitrogen doped silicon layer," *Microelectronics Reliability*, 41, 981–985 (2001), have shown that reduction of boron diffusion is obtained by having nitrogen doped silicon layer at the gate dieletric and gate conductor interface. Jalabert et al. obtained the nitrogen doped interface by reacting disilane and ammonia ($NH_3$) in a low pressure chemical vapor deposition (LPCVD) furnace. Furthermore, it has been shown in the literature that an amorphous silicon layer reduces boron diffusion. There is also evidence that having low carbon concentration (less than $10^{20}/cm^{-3}$) in the silicon-germanium (SiGe) region of SiGe hetero bipolar transistors (HBT) can significantly suppress boron out-diffusion caused by later thermal processing steps. Thus, it has been desired to control the introduction of carbon into films.

In most cases, carbon is introduced in the film by adding an organic material in the gas mixture during the deposition of silicon or silicon-germanium films. Carbon also can be implanted in the film, although implantation damage may be caused.

Conventionally, various films have been produced.

For example, U.S. Pat. No. 6,268,299 (Jul. 31, 2001) discloses formation of silicon-rich silicon nitride films used for barrier application. The silicon nitride films are deposited using various silicon containing precursors, e.g., bis-tertiary butyl amino silane (BTBAS), HCD, $SiH_4$, etc., and $NH_3$. The silicon to nitrogen ratio is modulated by changing the flow ratio of the silicon-containing precursor and $NH_3$. The deposition takes place in LPCVD batch furnaces.

U.S. Pat. No. 6,486,015 (Nov. 26, 2002) discloses carbon-rich oxynitride, with reactive ion etching (RIE) selectivity due to carbon in the oxynitride film.

U.S. Pat. No. 6,500,772 (Dec. 31, 2002) discloses plasma enhanced growth of oxynitride and nitride using BTBAS and $N_2O$ and $NH_3$. Carbon is incorporated in the nitride and oxynitride films.

U.S. Pat. App. 2003/0020108 (Jan. 30, 2003) discloses decreasing the etch rate of silicon oxide films by doping the film with carbon (p 0038). Silicon oxide films are formed with varying amounts of oxygen, carbon and nitrogen.

U.S. Pat. No. 6,518,626 (Feb. 11, 2003) discloses oxynitride films, with carbon incorporation and etch rate as a function of $N_2O/O_2$ ratio, in a batch furnace. Film deposition is by BTBAS and $N_2O$ (with or without $O_2$).

The conventional films and methods for producing films have not necessarily provided all of the film characteristics that may be desirable for responding to the challenges of 90-nm and sub-90 nm technology. Nor are there adequately simple, feasible production methodologies for making films to have desired characteristics.

SUMMARY OF THE INVENTION

It is an object of the present invention to provide a polysilicon film in which the carbon and/or nitrogen content is desirably controlled.

It is another object to provide a method of controllably producing a polysilicon thin film.

It is yet another object of this invention to provide a method of controlling delivery of carbon and/or nitrogen to a film being formed.

It also is an object of this invention to provide a film that has desired characteristics for use in CMOS applications.

The present invention exploits the properties of compounds comprising Si, N and C (in any combination) for producing films. Preferably, the compound comprising Si, N and C is

$$(R-NH)_{4-n}SiX_n \qquad (I)$$

wherein R is an alkyl group (which may be the same or different), n is 1, 2 or 3, and X is H or halogen. As a most preferred example, the compound comprising Si, N and C is bis-tertiary butyl amino silane (BTBAS).

According to the invention, there is provided a novel way of depositing a carbon- and nitrogen-doped polysilicon film. The present inventors have determined that a mixture (A) silane ($SiH_4$) (or a silane derivative, such as, e.g., disilane, trisilane, hexachloro disilane, dichloro silane, etc.), with (B) a compound comprising Si, N and C in any combination (preferably,

$$(R-NH)_{4-n}SiX_n \qquad (I)$$

wherein R is an alkyl group (which may be the same or different), n is 1, 2 or 3, and X is H or halogen, and most preferably, bis-tertiary butyl amino silane (BTBAS)), may be used for controllable film production. By varying the (A)/(B) mixture ratio (such as, e.g., the $SiH_4$ to BTBAS ratio) and the process conditions, the amorphous/polycrystalline characteristic of the interfacial region and the nitrogen and carbon ratio in the film can be adjusted. Most advantageously, a polysilicon film can be produced by controlling the (A)/(B) mixture ratio (such as, e.g., the silane to BTBAS ratio).

An exemplary process according to the invention is a process for growing amorphous or polycrystalline silicon, comprising: growing a film, including mixing: (A) $SiH_4$ (silane) or a silane derivative (e.g., disilane, trisilane, hexachloro disilane and dichloro silane, etc.), with (B) a compound comprising Si, N and C in any combination. The compound comprising Si, N and C preferably may be $(R-NH)_{4-n}SiX_n$ wherein R is an alkyl group (which may be the same or different), n is 1, 2 or 3, and X is H or halogen. Most preferably, the compound comprising Si, N and C may be bis-tertiary butyl amino silane (BTBAS).

In another embodiment, the invention provides a reagent mixture from which to grow a film, comprising (A) $SiH_4$ or a silane derivative mixed with (B) a compound comprising Si, N and C in any combination. A preferred example of compound (B) is a compound of formula $(R-NH)_{4-n}SiX_n$ wherein R is an alkyl group (which may be the same or different), n is 1, 2 or 3, and X is H or halogen. The inventive reagent mixture may be used to grow a polycrystalline film or an amorphous film, by SiH$_4$ mixed with BTBAS.

In a further embodiment, the invention provides a film controllably doped with carbon and/or nitrogen, produced by a process in which a compound comprising Si, N and C in any combination was mixed with SiH$_4$ or a silane derivative. As the compound comprising Si, N and C preferably may be used a compound of formula (R—NH)$_{4-n}$SiX$_n$ wherein R is an alkyl group (which may be the same or different), n is 1, 2 or 3, and X is H or halogen. The invention may be used to provide a film comprising carbon-rich and nitrogen-rich silicon, the nitrogen and carbon being at the interface of gate dielectric and poly (or amorphous) silicon, the film having a sheet-like nitrogen and carbon profile.

BRIEF DESCRIPTION OF THE DRAWINGS

The foregoing and other objects, aspects and advantages will be better understood from the following detailed description of the preferred embodiments of the invention with reference to the drawings, in which:

FIGS. 1A, 1B and 1C are X-ray Photoelectron Spectroscopy (XPS) spectra (around the Si2p binding energy) for a film made by a process without BTBAS flow (FIG. 1A), with a very high BTBAS flow (FIG. 1B), and with intermediate BTBAS flow (FIG. 1C).

DETAILED DESCRIPTION OF A PREFERRED EMBODIMENT OF THE INVENTION

In one embodiment, the invention provides a process for growing a film (such as an amorphous or polycrystalline silicon film) by a process comprising mixing one (A) silane (SiH$_4$) or a silane derivative (such as, e.g., disilane, trisilane, hexachloro disilane, dichloro silane, etc.) and (B) a compound comprising Si, N and C in any combination.

Figure 3:
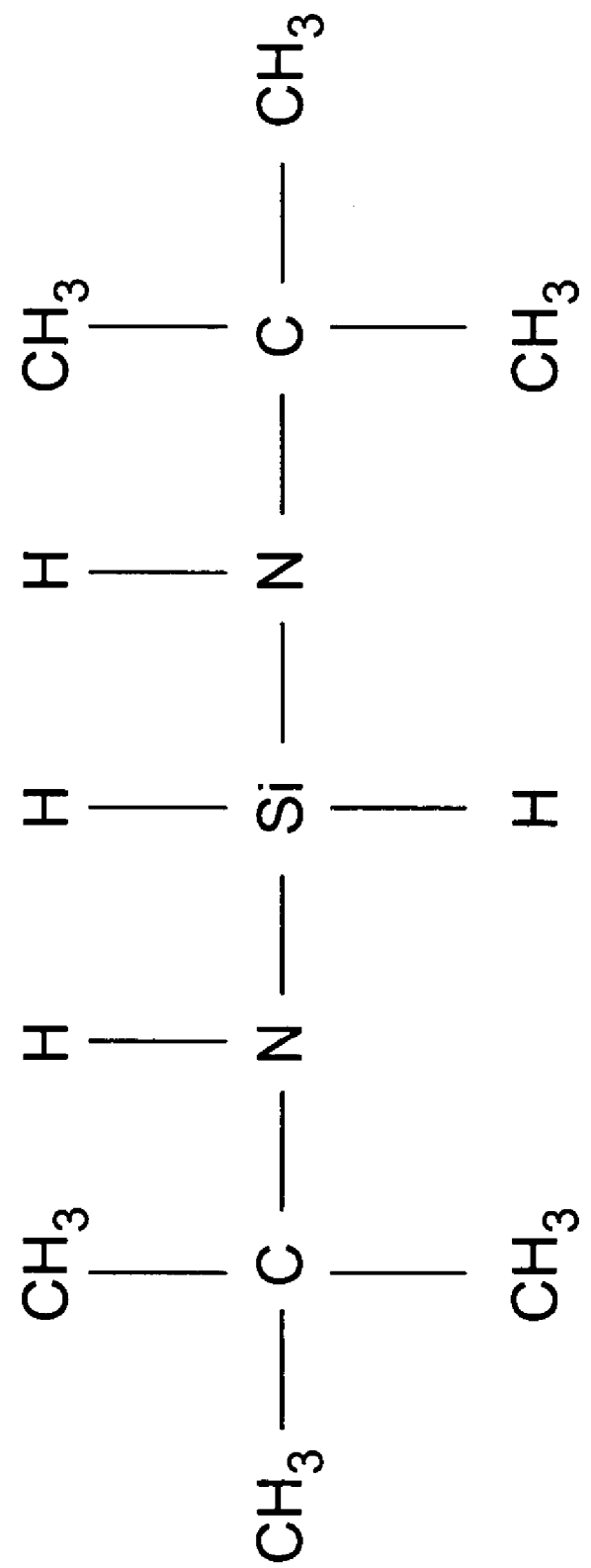
FIG. 3 is the chemical structure for BTBAS.

As a most preferable example of the compound comprising Si, N and C is mentioned BTBAS, which has chemical structure shown in FIG. 3. BTBAS is a commercially available reagent. For example, BTBAS may be purchased from Schumacher of Carlsbad, Calif.

In an especially preferred embodiment of the invention, a mixture of at least SiH$_4$ and BTBAS are used as reagents for making a film. Such a mixture of SiH$_4$ and BTBAS may be used for producing a polysilicon film or an amorphous film, according to the process conditions and/or ratio of SiH$_4$ to BTBAS. In the example of addition of BTBAS to SiH$_4$ according to the present invention, carbon and nitrogen are incorporated into the silicon film. Advantageously, this carbon and nitrogen incorporation can deter boron (B) diffusion and improve poly depletion, etc.

The production of films according to the invention may be performed in, and using, conventionally known equipment, for example, a furnace. Films according to the invention may be deposited in a single wafer Rapid Thermal Chemical Vapor Deposition (RTCVD) tool. Alternatively, films according to the film may be deposited by other techniques, such as, Low Pressure Chemical Vapor Deposition (LPCVD) and plasma processes such as Plasma Enhanced CVD (PECVD).

In producing films according to the invention, growth times may be used in accordance with characteristics desired for the film under production, such as, for example, a growth time in a range of 15 to 600 seconds for a RTCVD or PECVD process. In producing films according to the invention, pressure used may be in a range of sub-millitorr to atmosphere, at a temperature in a range of 300 C to 800 C. For growing a polysilicon film according to the invention, e.g., silane in a range of 1 to 99% may be mixed with BTBAS, in a range of 1 to 99%.

In depositing amorphous and polysilicon films, by using a mixture of a compound comprising Si, N and C in any combination (such as, most preferably, BTBAS) with silane or a silane derivative, film characteristics can be controlled, such as controlling the amount of C and N in the film (e.g., introducing a small amount of C and N in the film), controlling the amorphous/polysilicon ratio of the deposited film, etc.

The characteristic of a film under production may be manipulated by controlling the addition to the silane or silane derviative, of at least one compound comprising Si, N and C in any combination (such as $$(R\text{—}NH)_{4-n}SiX_n \tag{I}$$

wherein R is an alkyl group, n is 1, 2 or 3, and X is H or halogen, of which BTBAS is a most preferred example). For example, the characteristic of a film being produced as a polysilicon film or a non-polysilicon film may be controlled by manipulating addition of BTBAS to SiH$_4$ during film formation. For example, a very thin layer of carbon and nitrogen doped polysilicon may be deposited in the interface using BTBAS/SiH$_4$ and then gas delivery may switch to an SiH$_4$-only process; or, an entire stack may be deposited with BTBAS/SiH$_4$; etc. A single or multi-stack film may be produced, depending on the application.

The characteristic of the produced film as poly or amorphous may be controlled by providing the film as either silicon (Si) (poly) or silicon germanium (Si—Ge) (amorphous). For producing an Si—Ge film, germanium is supplied during film production.

Deposited films may be studied using known analytical techniques such as XPS (chemical bonding and elemental information), Auger (elemental composition) and XRD (crystallinity).

FIG. 1A is an XPS spectra from a film deposited without BTBAS flow. There is a predominant Si2p peak at 98–100 eV which is evidence of pure poly silicon. The additional peak at 101–104 eV corresponds to a surface native oxide peak typically seen for poly Si films.

Figure 1B:
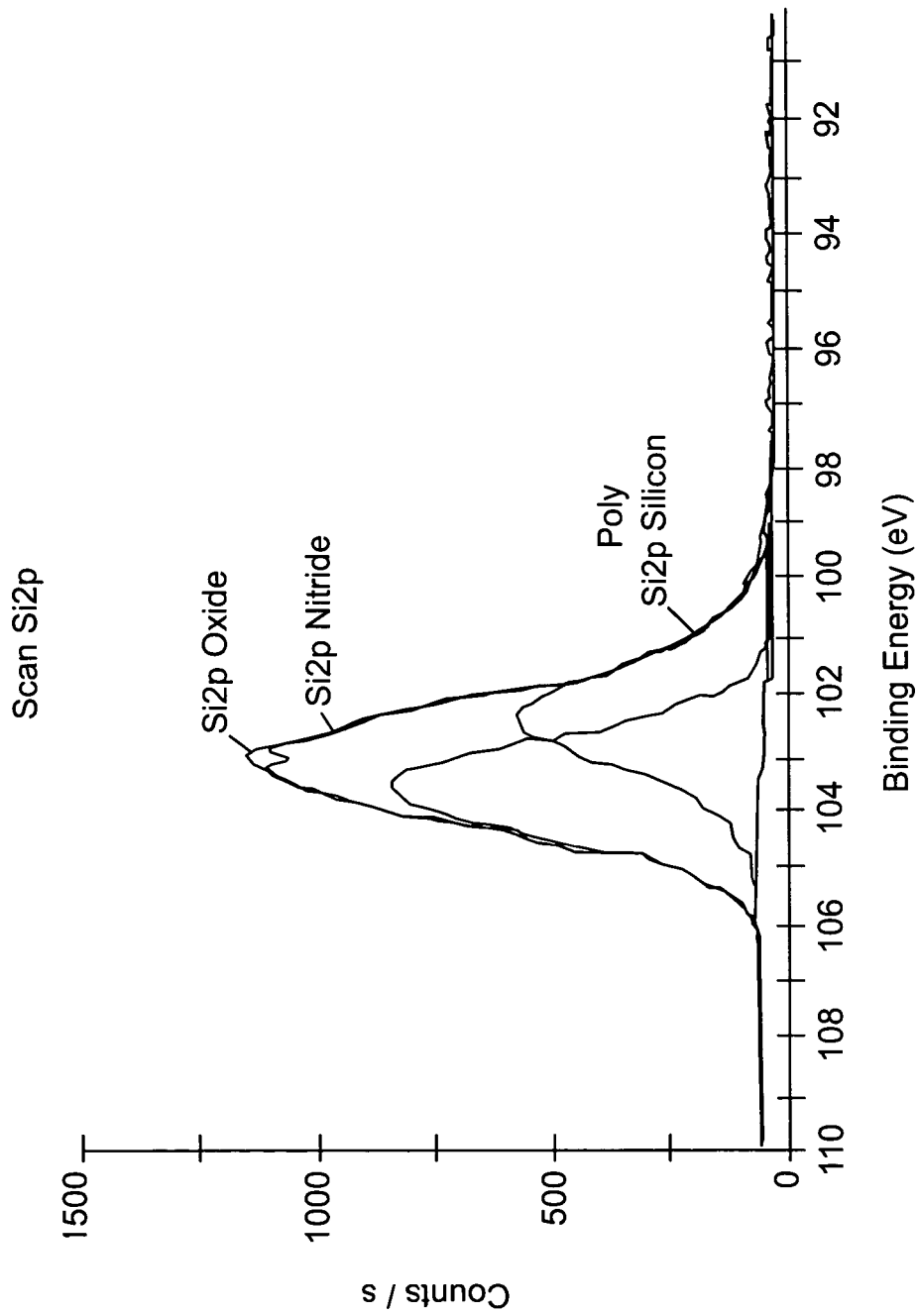

FIG. 1B is an XPS spectra from a film deposited with a very high BTBAS flow. Two peaks in the range 100–106 eV corresponding to SiOx and SiNx are seen. There are no peaks in the 98–100 eV region (corresponding to Si) suggesting that all the Si is bonded with N, O or C.

Figure 1C:
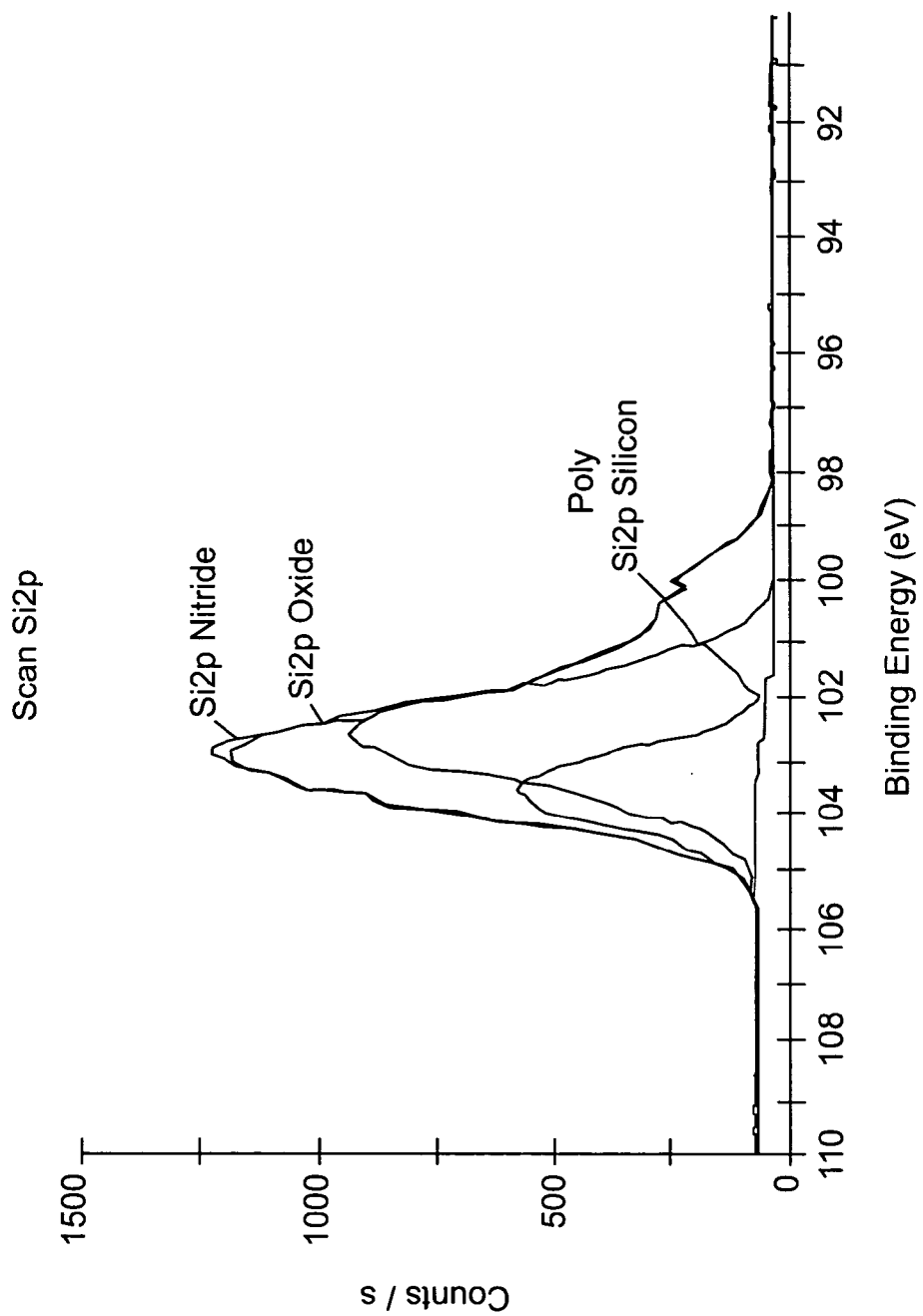

FIG. 1C is an XPS spectra from a film deposited using an intermediate BTBAS flow. Two peaks in the range 100–106 eV corresponding to SiOx and SiNx are seen. There is an additional peak at 98–100 eV corresponding to unbonded poly Si.

Figure 2A:
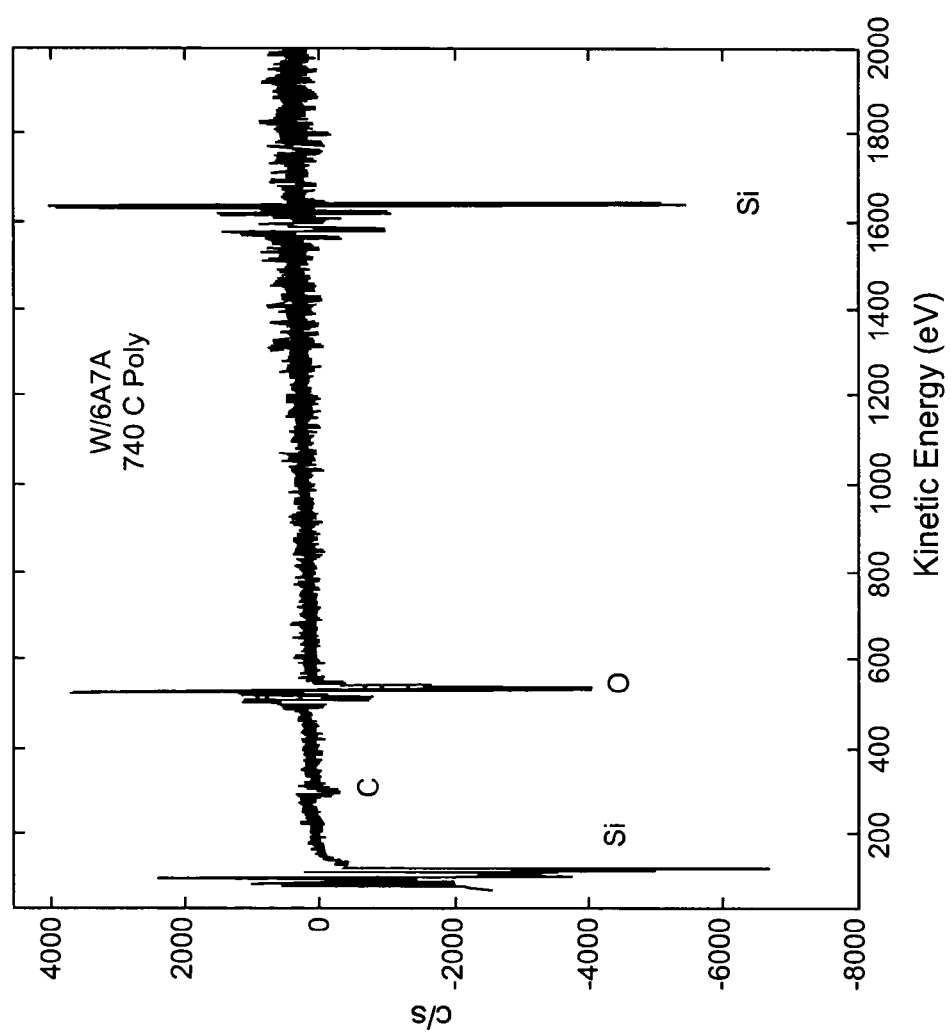
FIGS. 2A and 2B are Auger spectra of the films deposited without and with BTBAS respectively.

FIG. 2A is an Auger spectrum from a typical poly Si film. It shows a small C peak and no N peak.

Figure 2B:
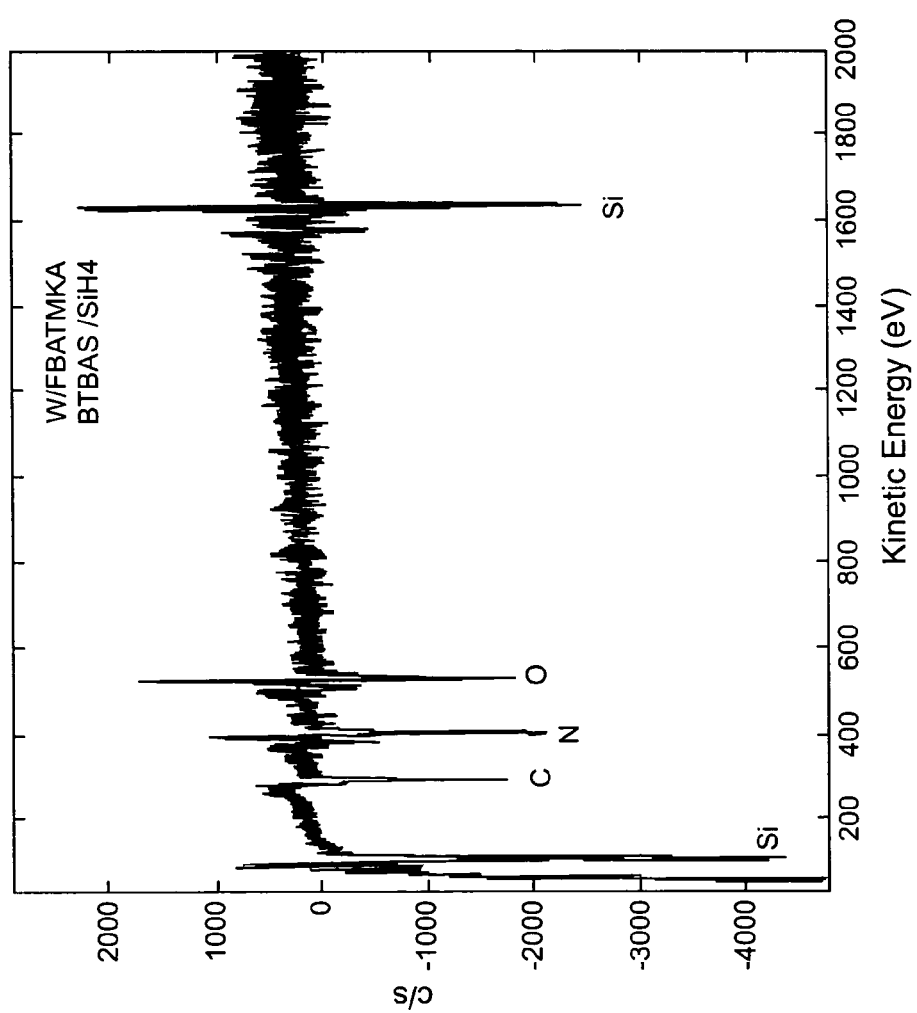

FIG. 2B is an Auger spectrum from a film made with BTBAS and SiH$_4$. There are large C and N peaks. This suggests that both C and N can be incorporated into the film with the introduction of BTBAS.

INVENTIVE EXAMPLE 1

Films were produced according to the conditions and parameters set forth in Table 1 below.

TABLE 1

|  | Exp. 1 | Exp. 2 | Exp. 3 |
|---|---|---|---|
| Time (sec) | 60 | 60 | 60 |
| Pressure (torr) | 100 | 100 | 100 |
| Heater Temp. (C.) | 700 | 700 | 700 |
| Spacing (mil) | 550 | 550 | 550 |
| Gases (sccm) | | | |
| $N_2$-1 | 8000 | 8000 | 8000 |
| $N_2$Purge | 5000 | 5000 | 5000 |
| $SiH_4$ | 45 | 45 | 45 |
| $H_2$ | 0 | 0 | 0 |
| BTBAS | 0 | 200 | 950 |
| Thickness (Angstroms) | 1118 | 365 | 179 |
| XPS | Poly Si No O, N | Poly Si O, N | No Poly Si O, N |
| Auger | No C | C | C |

Thus, experiment 2 in Table 1 shows an example of process conditions for forming a nitrogen and carbon doped polysilicon film. XPS analysis was performed on the films produced as reported in Table 1 and the present inventors found via XPS spectra the presence of poly in a film made using BTBAS, which result demonstrates the feasibility of growing poly using an $SiH_4$/BTBAS mixture.

In the film production according to Table 1, reagent gases were delivered simultaneously. However, it will be appreciated that in the invention, reagent gases are not required to be delivered with simultaneous flow, but may be adjusted according to the type of end product film that is desired. For example, a layered film may be produced. For example, to produce a layer of regular silicon, silane only may be delivered (without simultaneous delivery of BTBAS).

It will be appreciated that using BTBAS as mentioned above in the Example and Table 1 is an example of a compound useable in the present invention, and the invention is not limited thereto. BTBAS is one example of a compound comprising Si, N and C that is useable in the present invention. There may also be used as a compound comprising Si, N and C, a compound according to formula

$$(R-NH)_{4-n}SiX_n \qquad (I)$$

wherein R is an alkyl group, n is 1, 2 or 3, and X is H or halogen. The alkyl group used for "R" may be the same or different, and may be substituted or unsubstituted.

Films according to the present invention have industrial uses. An exemplary use of films according to the present invention is in a commercial product such as CMOS logic.

It further will be appreciated that the present invention provides films with novel characteristics compared to conventional films. The invention provides films that are superior to films produced according to the conventional method in which nitrogen content is increased in a gate oxide by post-oxidation plasma doping such as RPN, DPN, and so on, which conventional method creates an undesirable long N-tail into the channel resulting in PFET VT instability/increase and mobility degradation. By contrast, the present invention advantageously provides a film that is carbon-rich and nitrogen-rich silicon (poly or amorphous), with this nitrogen and carbon at the interface of gate dielectric and poly (or amorphous) silicon which results in a desired sheet-like nitrogen and carbon profile. Such films having a sheet-like nitrogen and carbon profile and according to the present invention can reduce leakage (Ig) without mobility degradation and/or PFET VT instability/increase, due to the fact that nitrogen and carbon are not penetrating the gate oxide film, and are remaining at the poly/amorphous silicon and gate dielectric interface and not in the gate dielectric and Si-channel interface. Thus, novel and useful films are provided by the present invention.

While the invention has been described in terms of its preferred embodiments, those skilled in the art will recognize that the invention can be practiced with modification within the spirit and scope of the appended claims.

We claim:

1. A process for growing amorphous or polycrystalline silicon, comprising:
   growing a film, including mixing:
   (A) $SiH_4$ or a silane derivative selected from the group consisting of disilane, trisilane, hexachloro disilane and dichloro silane, with
   (B) his-tertiary butyl amino silane (BTBAS),
   with a growth time in a range of 15 to 600 seconds for a RTCVD or PECVD process, at a pressure in a range of sub-millitorr to atmosphere, at a temperature in a range of 300 C to 800 C;
   wherein amorphous or polycrystalline silicon is grown.

2. The process of claim 1, wherein silane is mixed with BTBAS.

3. The process of claim 1, wherein a polysilicon film is grown.

4. The process of claim 3, including mixing:
   silane, in a range of 1 to 99% with
   BTBAS, in a range of 1 to 99%.

5. The process of claim 4, including mixing silane at 45 sccm with BTBAS at 200 sccm.

* * * * *